(12) United States Patent
Wu et al.

(10) Patent No.: US 12,272,776 B2
(45) Date of Patent: Apr. 8, 2025

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Chao Wu, Beijing (CN); Lili Du, Beijing (CN); Yao Huang, Beijing (CN); Chao Zeng, Beijing (CN); Yuanyou Qiu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 630 days.

(21) Appl. No.: 17/593,341

(22) PCT Filed: Dec. 25, 2020

(86) PCT No.: PCT/CN2020/139538
§ 371 (c)(1),
(2) Date: Sep. 15, 2021

(87) PCT Pub. No.: WO2022/134038
PCT Pub. Date: Jun. 30, 2022

(65) Prior Publication Data
US 2022/0406979 A1  Dec. 22, 2022

(51) Int. Cl.
*H01L 33/62* (2010.01)
*H01L 27/15* (2006.01)

(52) U.S. Cl.
CPC ........... *H01L 33/62* (2013.01); *H01L 27/156* (2013.01)

(58) Field of Classification Search
CPC .......... H01L 33/62; H01L 27/156; G09G 2300/0413; G09G 2320/0233; G09G 3/32;
(Continued)

(56) References Cited

U.S. PATENT DOCUMENTS 11,737,325 B2*  8/2023  Yang ............... H10K 59/1213
                                                    257/71
2016/0196795 A1*  7/2016  Kim .................. G09G 3/3696
                                                    345/211
(Continued)

FOREIGN PATENT DOCUMENTS

CN  110599944 A  12/2019
CN  110648622 A   1/2020
(Continued)

*Primary Examiner* — Marcos D. Pizarro
*Assistant Examiner* — Tiberiu Dan Onuta
(74) *Attorney, Agent, or Firm* — McCoy Russell LLP (57) ABSTRACT

The present disclosure provides a display panel and a display device. The display panel includes: a base substrate, a display region including a first region, a second region and a transition region; first light-emitting elements at the first region; second light-emitting elements, first pixel circuitries and second pixel circuitries at the transition region, each first pixel circuitry being arranged between adjacent second pixel circuitries, an orthogonal projection of at least one second pixel circuitry onto the base substrate at least partially overlapping an orthogonal projection of at least one second light-emitting element onto the base substrate; first conductive lines each coupled between at least one first pixel circuitry and at least one first light-emitting element; and second conductive lines each coupled to at least one first pixel circuitry and extending along the at least one first pixel circuitry to a side away from the at least one first light-emitting element.

18 Claims, 6 Drawing Sheets

(58) Field of Classification Search
CPC ........ G09G 3/20; H10K 59/65; H10K 59/121; H10K 59/131; G09F 9/30
See application file for complete search history.

(56) References Cited

U.S. PATENT DOCUMENTS

| | | |
|---|---|---|
| 2021/0313405 A1 | 10/2021 | Xu et al. |
| 2021/0408182 A1 | 12/2021 | Chung et al. |
| 2022/0020328 A1* | 1/2022 | Lim ...................... G09G 3/3258 |
| 2022/0131111 A1* | 4/2022 | Lee ...................... G06F 3/0446 |
| 2022/0181429 A1* | 6/2022 | Morita ................. G09G 3/3266 |
| 2022/0293715 A1* | 9/2022 | Du ....................... H10K 59/131 |

FOREIGN PATENT DOCUMENTS

| | | |
|---|---|---|
| CN | 110767662 A | 2/2020 |
| CN | 111477676 A | 7/2020 |
| CN | 111489681 A | 8/2020 |
| CN | 111833796 A | 10/2020 |
| CN | 111916486 A | 11/2020 |
| WO | 2020067611 A1 | 4/2020 |

* cited by examiner

DISPLAY PANEL AND DISPLAY DEVICE

CROSS REFERENCE TO RELATED APPLICATIONS

The present application is a U.S. National Phase of International Application No. PCT/CN2020/139538 entitled "DISPLAY PANEL AND DISPLAY DEVICE," and filed on Dec. 25, 2020. The entire contents of each of the above-listed applications are hereby incorporated by reference for all purposes.

TECHNICAL FIELD

The present disclosure relates to the field of display technology, in particular to a display panel and a display device.

BACKGROUND

In the related art, in order to provide a larger display area and increase a screen-to-body ratio, a full-screen display product has emerged. For a front-facing camera, an under-screen camera is adopted by many full-screen display products. A light transmittance is increased through decreasing Pixels Per Inch (PPI) at a camera region, so as to improve imaging quality and provide a display function at the camera region. However, currently there are such problems as uneven brightness at the camera region as well as a too small camera region.

SUMMARY

An object of the present disclosure is to provide a display panel and a display device, so as to solve such problems in the related art as uneven brightness at the camera region as well as a too small camera region.

The technical solutions in the embodiments of the present disclosure will be described as follows.

In one aspect, the present disclosure provides in some embodiments a display panel, including: a base substrate including a display region, the display region including a first region, a second region surrounding the first region, and a transition region between the first region and the second region, a light transmittance of the first region being greater than that of the second region; a plurality of first light-emitting elements arranged at the first region; a plurality of second light-emitting elements, a plurality of first pixel circuitries and a plurality of second pixel circuitries arranged at the transition region, each first pixel circuitry being arranged between adjacent second pixel circuitries, an orthogonal projection of at least one second pixel circuitry onto the base substrate at least partially overlapping an orthogonal projection of at least one second light-emitting element onto the base substrate; a plurality of first conductive lines each coupled between at least one first pixel circuitry and at least one first light-emitting element; and a plurality of second conductive lines each coupled to at least one first pixel circuitry and extending along the at least one first pixel circuitry to a side away from the at least one first light-emitting element.

In a possible embodiment of the present disclosure, an orthogonal projection of each second conductive line onto the base substrate overlaps an orthogonal projection of the at least one first pixel circuitry or at least one second pixel circuitry onto the base substrate.

In a possible embodiment of the present disclosure, each second conductive line extends along the at least one first pixel circuitry to a side away from the at least one first light-emitting element, and extends to a boundary between the second region and the transition region.

In a possible embodiment of the present disclosure, an end of each second conductive line extending to the boundary between the second region and the transition region is located at the transition region.

In a possible embodiment of the present disclosure, an end of each second conductive line extending to the boundary between the second region and the transition region is located at the second region.

In a possible embodiment of the present disclosure, an end of each of a part of the second conductive lines extending to the boundary between the second region and the transition region is located at the transition region, and an end of each of the other part of the second conductive lines extending to the boundary between the second region and the transition region is located at the second region.

In a possible embodiment of the present disclosure, the display panel further includes a plurality of third light-emitting elements arranged at the second region, each third light-emitting element at least includes one first subpixel, one second subpixel and two third subpixels, the two third subpixels are arranged in a same column and in different rows, the first subpixel and the second subpixel are arranged at a same side of the two third subpixels, and the first subpixel and the second subpixel are arranged in different columns and in different rows. In a first direction, a boundary of the first region includes a first lateral boundary and a second lateral boundary opposite to each other, at the first lateral boundary, the two third subpixels are arranged at a side close to the transition region, the first subpixel and the second subpixel are arranged at a side away from the transition region, and the first direction is a row direction of the third light-emitting elements. At the first lateral boundary, the ends of the second conductive lines extending to the boundary between the transition region and the second region are flush with each other and spaced apart from the third subpixel at the second region closest to the transition region by a first distance. At the second lateral boundary, the ends of the second conductive lines extending to the boundary between the transition region and the second region are not flush with each other, spaced apart from the first subpixel at the second region closest to the transition region by a second distance, and spaced apart from the second subpixel at the second region closest to the transition region by a third distance.

In a possible embodiment of the present disclosure, each of the first distance, the second distance and the third distance is greater than or equal to 2 μm.

In a possible embodiment of the present disclosure, an angle between the first conductive line and the second conductive line is 175°±5°.

In a possible embodiment of the present disclosure, each first pixel circuitry includes a dummy electrode arranged at a side of the first conductive line away from the base substrate and electrically coupled to the first conductive line.

In a possible embodiment of the present disclosure, the display panel further includes a plurality of third light-emitting elements and a plurality of third pixel circuitries arranged at the second region, and a density of the third light-emitting elements is greater than or equal to a density of the first light-emitting elements at the first region and a density of the second light-emitting elements at the transition region.

In a possible embodiment of the present disclosure, a light transmittance of each of the first conductive lines and the second conductive lines is greater than or equal to 50%.

In a possible embodiment of the present disclosure, the first conductive lines are arranged at a same layer, and made of a same material, as the second conductive lines.

In a possible embodiment of the present disclosure, each of the first conductive lines and the second conductive lines is made of indium tin oxide (ITO) or indium zinc oxide (IZO).

In a possible embodiment of the present disclosure, the display panel further includes at least one third conductive line, each third conductive line is coupled between at least one first pixel circuitry and at least one first light-emitting element, and each third conductive line is arranged at a layer different from the first conductive line.

In a possible embodiment of the present disclosure, each first pixel circuitry includes a dummy electrode, and the third conductive line is arranged at a same layer, and made of a same material, as the dummy electrode.

In a possible embodiment of the present disclosure, each third conductive line extends from a dummy electrode at the transition region closest to the first region, and is coupled to a first light-emitting element at the first region closest to the transition region.

In another aspect, the present disclosure provides in some embodiments a display device including the above-mentioned display panel.

In a possible embodiment of the present disclosure, a camera element is arranged at a non-display side of the first region.

The present disclosure has the following beneficial effects.

According to the display panel and the display device in the embodiments of the present disclosure, the display region includes the first region, the second region and the transition region, and the light transmittance of the first region is greater than that of the second region (e.g., the first region is a region where an under-screen camera is located). In order to increase the light transmittance of the first region, control lines at the first region are optimized. The first light-emitting elements other than the pixel circuitries are arranged at the first region, and the second light-emitting elements, the first pixel circuitries and the second pixel circuitries are arranged at the second region. The first pixel circuitries and the second pixel circuitries are arranged alternately, and each second pixel circuitry is coupled to the corresponding second light-emitting element and configured to drive the second light-emitting element. At least one first pixel circuitry is coupled to at least one first light-emitting element through the first conductive line. In this way, it is able to drive the second light-emitting element at the transition region to emit light through the corresponding second pixel circuitry at the transition region and drive the first light-emitting element at the first region to emit light through the corresponding first pixel circuitry at the transition region, and it is merely necessary to provide the first light-emitting elements rather than any pixel circuitry at the first region, so it is able to increase the light transmittance of the first region without any limit on a size of the first region. In addition, the second conductive lines are further arranged at the transition region. Each second conductive line is coupled to at least one first pixel circuitry, and extends along the at least one first pixel circuitry to a side away from the at least one first light-emitting element. In other words, the first conductive line extends in a reverse direction toward the boundary between the transition region and the second region, so that each second conductive line extends through the transition region in a same manner as possible. As a result, a parasitic capacitance generated between each first conductive line for controlling the first light-emitting element at the first region to emit limit and the pixel circuitry at the transition region is substantially the same, so it is able to prevent the occurrence of uneven brightness at the camera region.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The related art will be described hereinafter prior to the detailed description about the embodiments of the present disclosure.

In the related art, in order to provide a larger display area and increase a screen-to-body ratio, a full-screen display product has emerged. For a front-facing camera, an under-screen camera is adopted by many full-screen display products. A light transmittance is increased through decreasing PPI at a camera region, so as to improve imaging quality and provide a display function at the camera region. A display region of an active area for the under-screen camera includes a high PPI area (a) (H area) and a low PPI area (b) (L area). The camera region (c) is arranged at the L area, and a part of the L area other than the camera region is called as a transition region. However, currently there are such problems as uneven brightness at the camera region as well as a too small camera region.

In the embodiments of the present disclosure, the arrangement of signal lines, control lines and light-emitting elements at the camera region of the L area is optimized, so as to provide even brightness at the camera region and prevent a size of the camera region from being limited.

Figure 1:
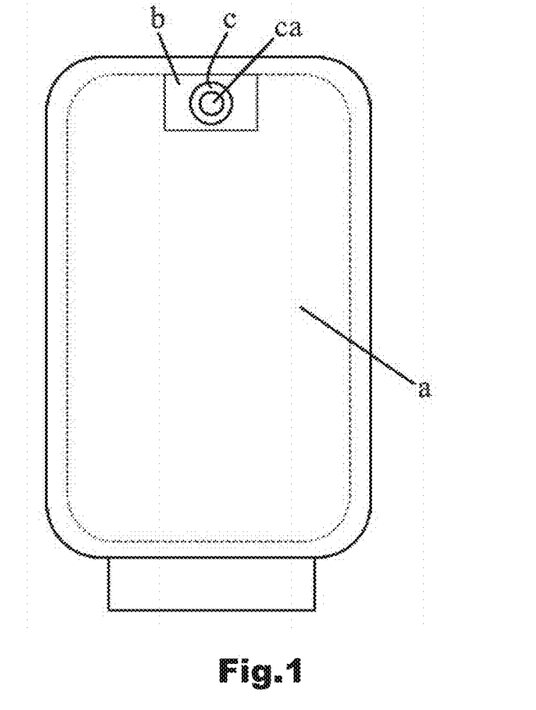
FIG. 1 is a schematic view showing a display region of a display panel according to one embodiment of the present disclosure.
Figure 2:
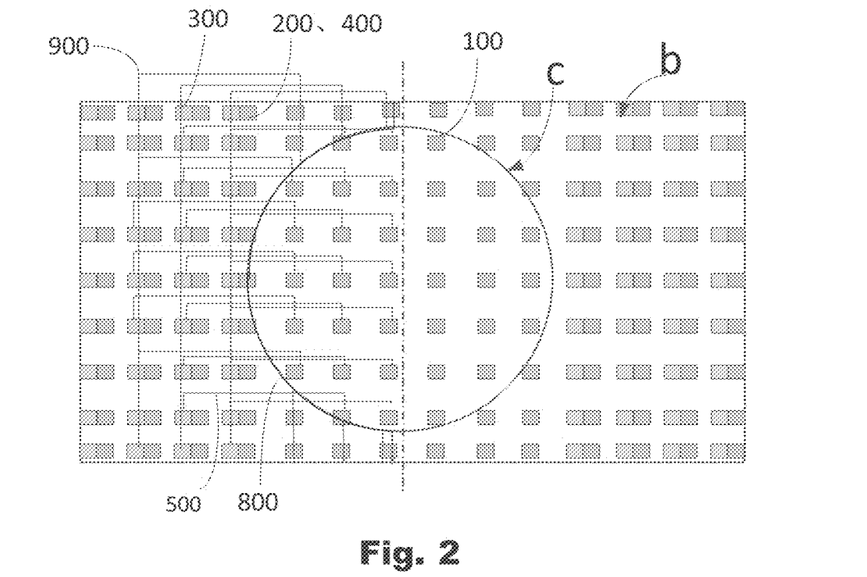
FIG. 2 is a schematic view showing a connection relationship between first light-emitting elements at a first region and first pixel circuitries at a transition region of the display panel with merely a part of first conductive lines according to one embodiment of the present disclosure.
Figure 3:
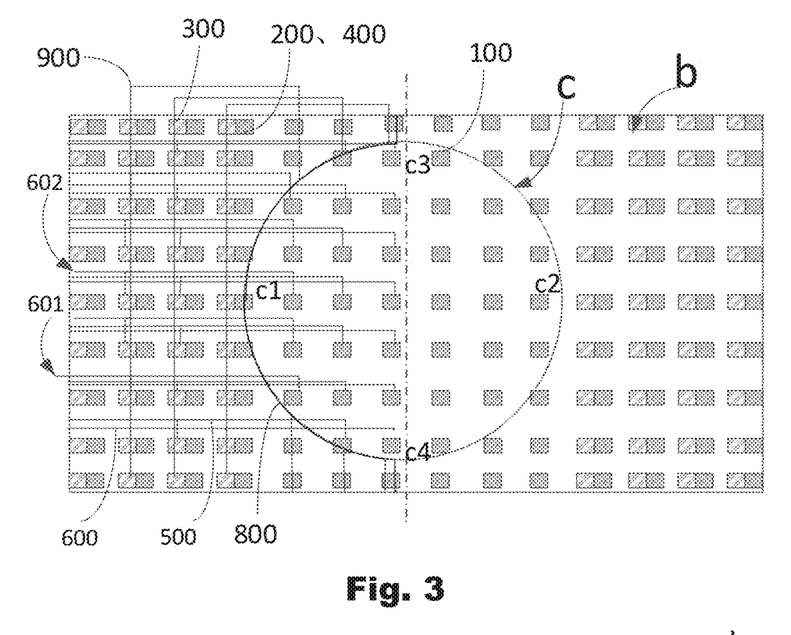
FIG. 3 is another schematic view showing the connection relationship between the first light-emitting elements at the first region and the first pixel circuitries at the transition region of the display panel with merely a part of first conductive lines and second conductive lines according to one embodiment of the present disclosure.

FIG. 1 is a schematic view showing a display region of a display panel according to one embodiment of the present disclosure, and FIGS. 2 and 3 are topical schematic views of the display region of the display panel. In order to clearly show a connection relationship among signal lines in the display panel, FIGS. 2 and 3 merely show a part of the signal lines.

As shown in FIGS. 1 to 3, the present disclosure provides in some embodiments a display panel, which includes: a base substrate including a display region, the display region including a first region c, a second region a surrounding the first region c, and a transition region b between the first region c and the second region a, a light transmittance of the first region c being greater than that of the second region a; a plurality of first light-emitting elements 100 arranged at the first region c; a plurality of second light-emitting elements 200, a plurality of first pixel circuitries 300 and a plurality of second pixel circuitries 400 arranged at the transition region b, each first pixel circuitry 300 being arranged between adjacent second pixel circuitries 400, an orthogonal projection of at least one second pixel circuitry 400 onto the base substrate at least partially overlapping an orthogonal projection of at least one second light-emitting element 200 onto the base substrate; a plurality of first conductive lines 500 each coupled between at least one first pixel circuitry 300 and at least one first light-emitting element 100; and a plurality of second conductive lines 600 each coupled to at least one first pixel circuitry 300 and extending along the at least one first pixel circuitry 300 to a side away from the at least one first light-emitting element 100.

In order to clearly show a connection relationship between the first conductive line 500 and the first pixel circuitry as well as the first light-emitting element and a connection relationship between the first conductive line 500 and the second conductive line 600, the second conductive line 600 is not shown in FIG. 2 but shown in FIG. 3. In addition, FIGS. 2 and 3 merely show a part of the conductive lines at a left side of the first region rather than those at a right side.

In the embodiments of the present disclosure, the first region c of the display region serves as a camera region, and the second region a is a normal display region.

Each of the first light-emitting elements 100 and the second light-emitting elements 200 refers to an element capable of emitting light. For example, each of the first light-emitting elements 100 and the second light-emitting elements 200 includes an electroluminescent (EL) element.

It should be appreciated that, as mentioned above, at least one first pixel circuitry 300 is coupled to at least one first light-emitting element 100 via the first conductive line 500. In other words, one first pixel circuitry 300 is configured to drive at least one first light-emitting element 100 at the first region c. For ease of description, one first pixel circuitry 300 and a corresponding first light-emitting element 100 coupled thereto via the first conductive line 500 are called as a paired unit. Each second conductive line 600 is coupled to at least one first pixel circuitry 300, and extends along the at least one first pixel circuitry 300 to a side away from the at least one first light-emitting element 100, i.e., each second conductive line 600 extends from the first pixel circuitry 300 coupled thereto toward the first light-emitting element 100 which forms a paired unit with the first pixel circuitry 300.

As mentioned above, in order to increase the light transmittance of the first region c, control lines at the first region c are optimized. The first light-emitting elements 100, rather than the pixel circuitries, are merely arranged at the first region c. The second light-emitting elements 200, the first pixel circuitries 300 and the second pixel circuitries 400 are arranged at the second region a. The first pixel circuitries 300 and the second pixel circuitries 400 are arranged alternately, and each second pixel circuitry 400 is coupled to the corresponding second light-emitting element 200 and configured to drive the second light-emitting element 200. The orthogonal projection of each second pixel circuitry 400 onto the base substrate at least partially overlaps the orthogonal projection of the corresponding second light-emitting element 200 onto the base substrate. In other words, the second pixel circuitry 400 is a pixel circuitry capable of driving the light-emitting element, while the first pixel circuitry 300 is a dummy pixel circuitry incapable of driving the light-emitting element. At least one first pixel circuitry 300 is coupled to at least one first light-emitting element 100 through the first conductive line 500. In this way, it is able to drive the second light-emitting element 200 at the transition region b to emit light through the corresponding second pixel circuitry 400 at the transition region b and drive the first light-emitting element 100 at the first region c to emit light through the corresponding first pixel circuitry 300 at the transition region b, and it is merely necessary to provide the first light-emitting elements 100 rather than any pixel circuitry at the first region c, so it is able to increase the light transmittance of the first region c without any limit on a size of the first region c. In addition, the second conductive lines 600 are further arranged at the transition region b. Each second conductive line 600 is coupled to at least one first pixel circuitry 300, and extends along the at least one first pixel circuitry 300 to a side away from the at least one first light-emitting element 100. In other words, the first conductive line 500 extends toward a boundary between the transition region b and the second region a, so that each second conductive line 600 extends through the transition region b in a same manner as possible. As a result, a parasitic capacitance generated between each first conductive line 500 for controlling the first light-emitting element 100 at the first region c to emit limit and the pixel circuitry at the transition region b is substantially the same, so it is able to prevent the occurrence of uneven brightness at a camera region.

In some embodiments of the present disclosure, an orthogonal projection of each second conductive line 600 onto the base substrate overlaps an orthogonal projection of the at least one first pixel circuitry 300 or at least one second pixel circuitry 400 onto the base substrate.

In addition, in some embodiments of the present disclosure, each second conductive line 600 extends along the at least one first pixel circuitry 300 to a side away from the at least one first light-emitting element 100, and extends to a boundary between the second region a and the transition region b. In this way, it is able to ensure that each second conductive line 600 extends through the transition region b in a same manner as possible.

In some embodiments of the present disclosure, an end 602 of each second conductive line 600 extending to the boundary between the second region a and the transition region b is located at the transition region b; or an end 601 of each second conductive line 600 extending to the boundary between the second region a and the transition region b is located at the second region a; or an end 602 of each of a part of the second conductive lines 600 extending to the boundary between the second region a and the transition region b is located at the transition region b, and an end 601 of each of the other part of the second conductive lines 600 extending to the boundary between the second region a and the transition region b is located at the second region a.

As mentioned above, in order to prevent each second conductive line 600 from interfering with the second region a while ensuring that each second conductive line 600 extends through the transition region b in a same manner as possible, on the basis of a pixel circuitry structure at the second region a in an actual product, the end of each second conductive line 600 extending to the boundary between the second region a and the transition region b is located at the transition region b or the second region a, or the end 602 of each of a part of the second conductive lines 600 is located at the transition region b and the end 601 of each of the other part of the second conductive lines 600 is located at the second region a.

More details will be given hereinafter.

The display panel further includes a plurality of third light-emitting elements 700 arranged at the second region a. Pixel arrangement structures of the first light-emitting element 100, the second light-emitting element 200 and the third light-emitting element 700 are the same or different from each other. The following description will be given when the first light-emitting element 100, the second light-emitting element 200 and the third light-emitting element 700 have a same pixel arrangement structure.

Figure 5:
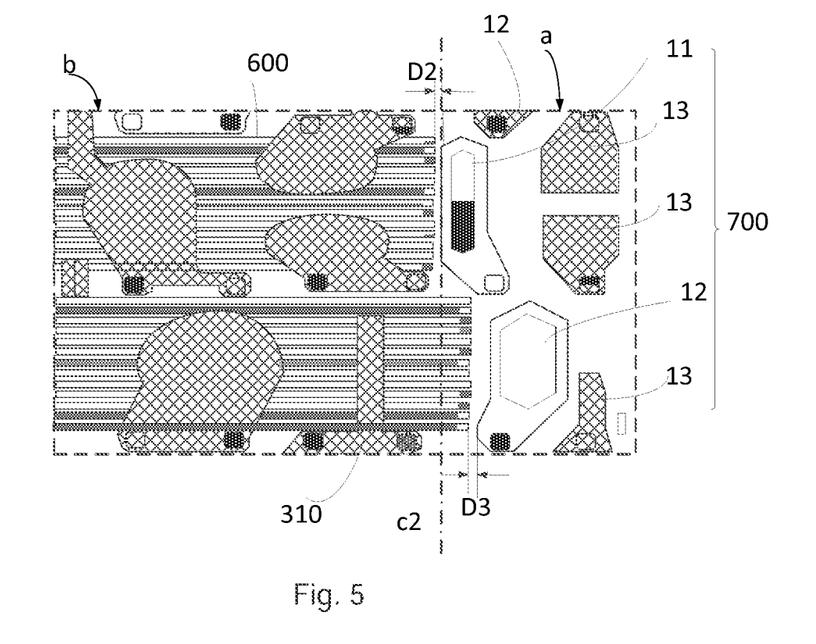
FIG. 5 is a schematic view showing a structure where the second conductive lines are located at a second lateral boundary of the first region according to one embodiment of the present disclosure.
Figure 6:
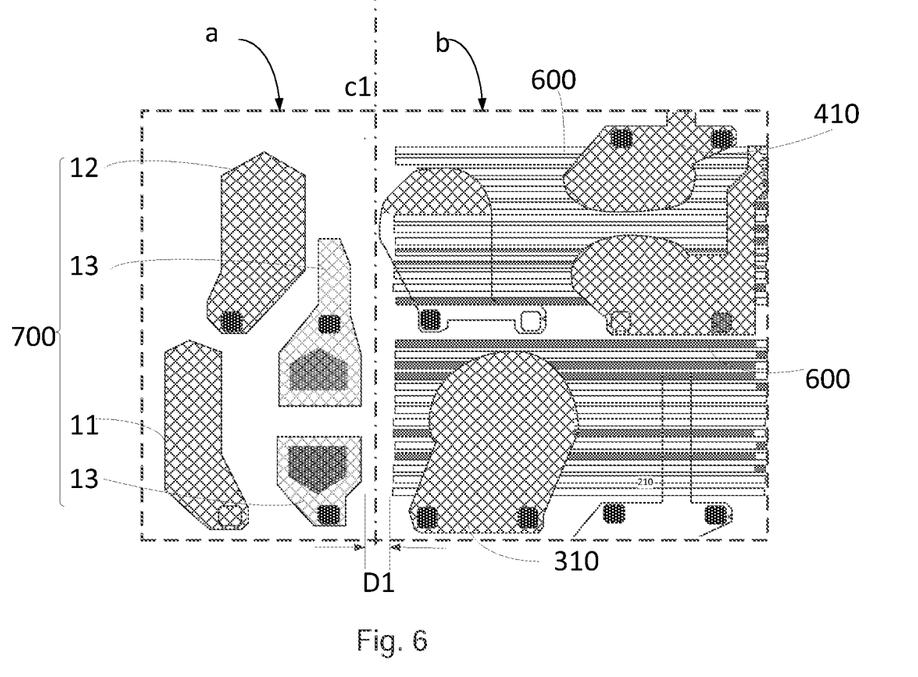
FIG. 6 is a schematic view showing a structure where the second conductive lines are located at a first lateral boundary of the first region according to one embodiment of the present disclosure.
Figure 7:
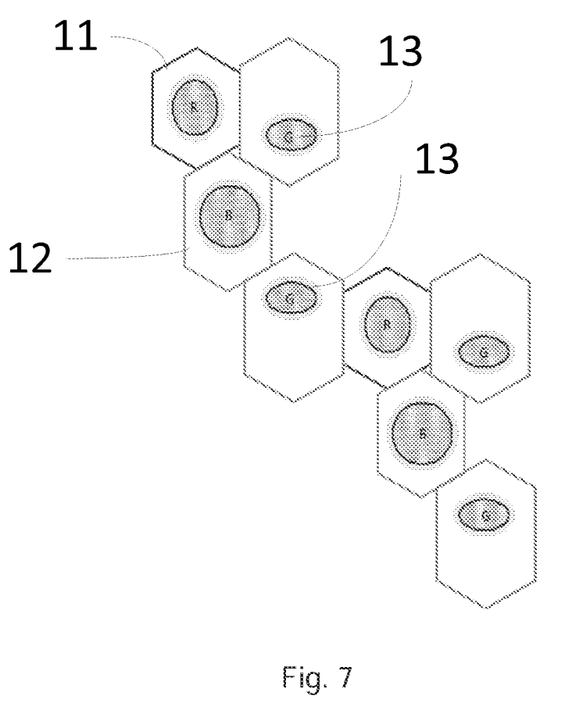
FIG. 7 is a schematic view showing the arrangement of pixels of each third light-emitting element of the display panel according to one embodiment of the present disclosure.

In some embodiments of the present disclosure, as shown in FIGS. 5, 6 and 7, each third light-emitting element 700 at least includes one first subpixel 11, one second subpixel 12 and two third subpixels 13, the two third subpixels 13 are arranged in a same column and in different rows, the first subpixel 11 and the second subpixel 12 are arranged at a same side of the two third subpixels 13, and the first subpixel 11 and the second subpixel 12 are arranged in different columns and in different rows. For example, the first subpixel 11 is a red subpixel, the second subpixel 12 is a blue subpixel, and the third subpixel 13 is a green subpixel.

As shown in FIGS. 4 to 7, in a first direction, i.e., in a row direction of the third light-emitting elements 700, two opposite sides of each third light-emitting element 700 are in different shapes. At a first side (i.e., a right side in FIG. 5), a right side of the first subpixel 11 is not flush with a right side of the second subpixel 12, and at a second side (i.e., a left side in FIG. 6), left sides of the two third subpixels 13 are flush with each other.

Hence, as shown in FIGS. 3, 5 and 6, in the first direction, a boundary of the first region c includes a first lateral boundary c1 and a second lateral boundary c2 opposite to each other. At the first lateral boundary c1, the two third subpixels 13 are arranged at a side close to the transition region b, the first subpixel 11 and the second subpixel 12 are arranged at a side away from the transition region b, and the first direction is the row direction of the third light-emitting elements 700.

At the first lateral boundary c1, the ends of the second conductive lines 600 extending to the boundary between the transition region b and the second region a are flush with each other and spaced apart from the third subpixel 13 at the second region a closest to the transition region b by a first distance D1.

At the second lateral boundary c2, the ends of the second conductive lines 600 extending to the boundary between the transition region b and the second region a are not flush with each other, spaced apart from the first subpixel 11 at the second region a closest to the transition region b by a second distance D2, and spaced apart from the second subpixel 12 at the second region a closest to the transition region b by a third distance D3.

It should be appreciated that, the above is for illustrative purposes only, and in actual use, a position of the end of each second conductive line 600 extending to the boundary between the transition region b and the second region a should be adjusted in accordance with actual positions of the subpixels.

For example, each of the first distance D1, the second distance D2 and the third distance D3 is greater than or equal to 2 μm.

In addition, in some embodiments of the present disclosure, a light transmittance of each of the first conductive lines 500 and the second conductive lines 600 is greater than or equal to 50%. In other words, each of the first conductive lines 500 and the second conductive lines 600 is a transparent conductive line, so as to provide the first region c with a better light transmittance. The light transmittance of each of the first conductive lines 500 and the second conductive lines 600 is within a range of 50% to 70%. For example, each of the first conductive lines 500 and the second conductive lines 600 is made of, but not limited to, ITO. For example, each of the first conductive lines 500 and the second conductive lines 600 is also made of IZO.

In addition, in some embodiments of the present disclosure, the first conductive lines 500 are arranged at a same layer, and made of a same material, as the second conductive lines 600. In other words, each first conductive line 500 and a corresponding second conductive line 600 form a same conductive line. Of course, it should be appreciated that, in actual use, the first conductive lines 500 are also arranged at a same layer as, but made of a different material from, the second conductive lines 600, or arranged at a different layer, and made of a different material, from the second conductive lines 600.

In addition, in some embodiments of the present disclosure, as shown in FIG. 3, an angle between the first conductive line 500 and the second conductive line 600 is 175°±5°. As mentioned hereinabove, the second conductive line 600 is located on a same straight line as the corresponding first conductive line 500. However, in actual use, depending on a circuit layout of the product itself, there is an angle between the second conductive line 600 and the corresponding first conductive line 500.

Figure 4:
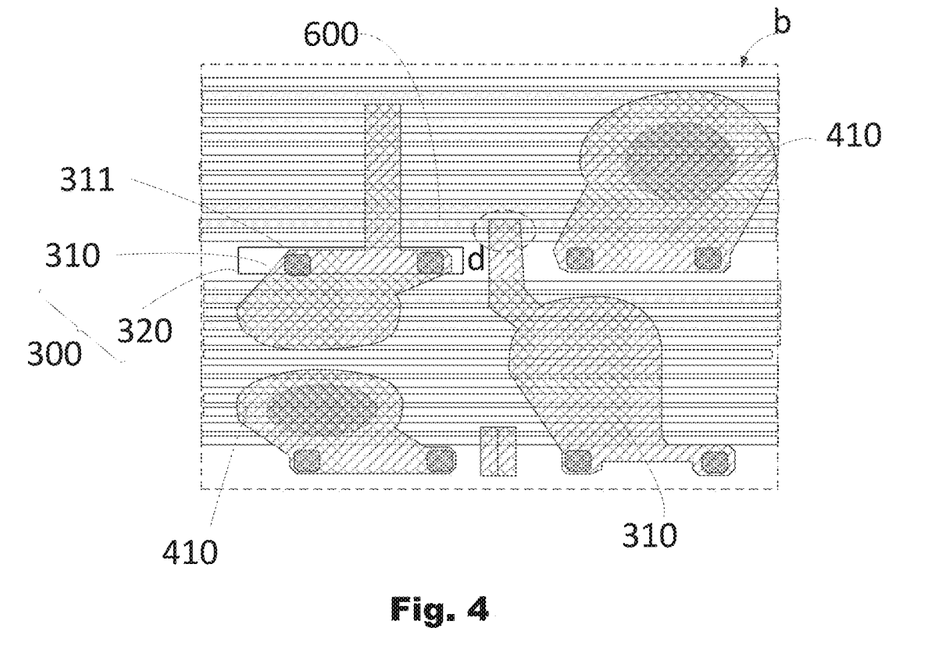
FIG. 4 is a schematic view showing a situation where a dummy electrode of the first pixel circuitry is lapped onto the first conductive line at the transition region of the display panel according to one embodiment of the present disclosure.

In addition, in some embodiments of the present disclosure, as shown in FIG. 4, each first pixel circuitry 300 includes a dummy electrode 310 rather than any light-emitting element. The dummy electrode 310 of the first pixel circuitry 300 is arranged at a side of the first conductive line 500 away from the base substrate, and electrically coupled to the first conductive line 500.

As mentioned hereinabove, the first pixel circuitry 300 includes the dummy electrode 310 with a same shape as an electrode in the second pixel circuitry 400. The dummy electrode 310 is a dummy anode or a dummy cathode. As compared with a mode where the first pixel circuitry 300 is coupled to the first conductive line 500 via any other member, when the first pixel circuitry 300 is coupled to the first conductive line 500 via the dummy electrode 310, it is able to ensure that the first conductive line 500 is a straight line.

For example, as shown in FIG. 4, each second pixel circuitry 400 includes an electrode 410 and a source/drain metal layer 320 (i.e., an SD layer not shown in FIG. 4) coupled to the electrode 410. Each first pixel circuitry 300 includes the dummy electrode 310 and a source/drain metal layer 320 coupled to the dummy electrode 310, and the source/drain metal layer 320 is arranged at a side of the dummy electrode 310 close to the base substrate. A first insulation layer is arranged between the source/drain metal layer 320 and the dummy electrode 310, and the dummy electrode 310 is lapped onto the source/drain metal layer 320 through a via-hole 311 in the first insulation layer. As shown in FIG. 4, one dummy electrode 310 is lapped onto the source/drain metal layer 320 through two via-holes 311. The first conductive line is arranged between the dummy electrode 310 and the source/drain metal layer 320, and directly lapped onto the dummy electrode 310. A sign d in FIG. 4 represents a position where the first conductive line 500 is lapped onto the dummy electrode 310.

In addition, in some embodiments of the present disclosure, the display panel further includes a plurality of third light-emitting elements 700 and a plurality of third pixel circuitries arranged at the second region a, and a density of the third light-emitting elements 700 is greater than or equal to a density of the first light-emitting elements 100 at the first region c and a density of the second light-emitting elements 200 at the transition region b.

In the embodiments of the present disclosure, in order to provide the first region c with a better light transmittance, the density of the first light-emitting elements 100 at the first region c is smaller than the density of the third light-emitting elements 700 at the second region a, and the density of the second light-emitting elements 200 at the transition region b is smaller than the density of the third light-emitting elements 700 at the second region a.

Of course, it should be appreciated that, in actual use, the density of the first light-emitting elements 100 at the first region c is also the same as the density of the third light-emitting elements 700 at the second region a, so as to provide the first region c with a better display effect.

In addition, in some embodiments of the present disclosure, as shown in FIG. 3, at the transition region b, the first pixel circuitries 300 in each column are further coupled to a fourth conductive line 800 and a fifth conductive line 900. The fourth conductive line 800 and the fifth conductive line 900 are configured to control a data signal applied to the first pixel circuitries 300 in each column.

In a second direction, i.e., in a column direction of the first light-emitting elements 100, the boundary of the first region c further includes a third lateral boundary c3 and a fourth lateral boundary c4 opposite to each other. Each fourth conductive line 800 extends from the third lateral boundary c3 of the first region c to the fourth lateral boundary c4 of the first region c through bypassing the first lateral boundary c1 of the second lateral boundary c2 of the first region c. One fifth conductive line 900 is coupled to the first pixel circuitries 300 in each column, and one end of the fifth conductive line 900 is coupled to a corresponding fourth conductive line 900.

In addition, in some embodiments of the present disclosure, because a line width of each first conductive line 500 and a pitch between the adjacent first conductive lines 500 are limited by a size of each pixel circuitry and a size of each light-emitting element, possibly there is insufficient room to provide sufficient first conductive lines to drive the first light-emitting elements 100.

Figure 8:
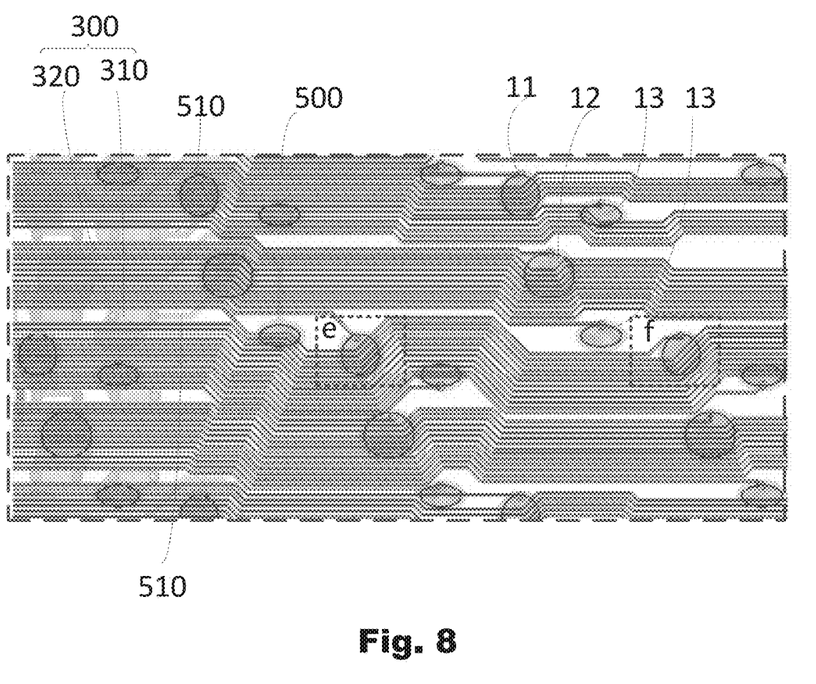
FIG. 8 is a schematic view showing a structure where the first light-emitting element at the first region is driven through the cooperation of a first conductive lien and a fourth conductive line according to one embodiment of the present disclosure.

In order to solve this problem, in some embodiments of the present disclosure, as shown in FIG. 8, the display panel further includes at least one third conductive line 510. Each third conductive line 510 is coupled between at least one first pixel circuitry 300 and at least one first light-emitting element 100, and each third conductive line 510 is arranged at a layer different from the first conductive line 500.

Based on the above, a part of the first light-emitting elements 100 are driven by the first conductive lines 500, and the other part of the first light-emitting elements 100 are driven by the third conductive lines 510 arranged at a layer different from the first conductive lines 500. In this way, it is able to solve the problem caused when there are insufficient first conductive lines 500 to drive all the first light-emitting elements 100.

For example, each first pixel circuitry 300 includes the dummy electrode 310 arranged at a same layer, and made of a same material, as the third conductive line 510.

Based on the above, the third conductive line 510 extends from the dummy electrode 310 of the first pixel circuitry 300 at the transition region b, so as to drive the first light-emitting element 100 at the first region c.

Of course, it should be appreciated that, the above is for illustrative purposes only, and in actual use, the third conductive line 510 is also made of any other material or layer.

In addition, for example, as shown in FIG. 8, each third conductive line 510 extends from a dummy electrode 310 at the transition region b closest to the first region b, and is coupled to a first light-emitting element 100 at the first region closest to the transition region.

Based on the above, the dummy electrode 310 is usually made of nontransparent metal, and in order to prevent the light transmittance from being adversely affected by the third conductive line 510 as possible, a line shall extend from the dummy electrode 310 closest to the first region c so as to form the third conductive line 510.

For ease of understanding, the following description will be given illustratively.

For example, as shown in FIG. 8, the cooperation of the first conductive lines 500 and the third conductive lines 510 depends on the quantity of the first light-emitting elements 100 at the first region c. Taking each light-emitting element consisting of pixels GGRB as an example, a pixel pitch is 60.2 μm. When the PPI at the first region c is ½ of the PPI at the second region a, a minimum repeating unit at the L area is 60.2*4=240.8 μm, a design diameter of the first region c is 3000 μm, and a width of each data signal line is 200 μm. Hence, the quantity of the first light-emitting elements 100 at the first region c is (3000+200*2)/240.8=14 (as shown in FIG. 8), and the total quantity of control lines for the first light-emitting elements 100 at the first region c is (14/2)*8=56.

For example, a pitch between adjacent first conductive lines 500 is about 4 μm, and due to the limit on a longitudinal size of each first light-emitting element 100, sizes of a space in the vicinity of the via-hole and a margin are about 8.2 μm, so the quantity of the first conductive lines 500 for a minim first light-emitting element 100 is [(60.2−8.2)/4]*4=52. Hence, it is impossible to drive all the first light-emitting elements 100 merely through the first conductive lines 500, and at this time, the third conductive lines 510 need to be provided so as to cooperate with the first conductive lines to drive all the first light-emitting elements 100.

As shown in FIG. 8, a light-emitting signal for a half of the first light-emitting element 100 at an edge of the first region c is controlled through the third conductive line 510 extending from the dummy electrode 310. In this way, within each of two pixel pitches between the first light-emitting elements 100, there is a remaining first conductive line 500 (indicated by e and f in FIG. 8) that is capable of being used to control the other first light-emitting element 100.

It should be appreciated that, the above is for illustrative purposes only, and in actual use, the cooperation of the first conductive line 500 with the third conductive line 510 is determined in accordance with such parameters of an actual product as a size of each conductive line and a size of each light-emitting element.

The present disclosure further provides in some embodiments a display device including the above-mentioned display panel. The display device is a display device with an under-screen camera, and a camera element ca is arranged at a non-display side of the first region c of the display panel. Obviously, the display device in the embodiments of the present disclosure also has the beneficial effects of the above-mentioned display panel, which will not be particularly defined herein.

Some description will be given as follows.

(1) The drawings merely relate to structures involved in the embodiments of the present disclosure, and the other structures may refer to those known in the art.

(2) For clarification, in the drawings for describing the embodiments of the present disclosure, a thickness of a layer or region is zoomed out or in, i.e., these drawings are not provided in accordance with an actual scale. It should be appreciated that, in the case that such an element as layer, film, region or substrate is arranged "on" or "under" another element, it may be directly arranged "on" or "under" the other element, or an intermediate element may be arranged therebetween.

(3) In the case of no conflict, the embodiments of the present disclosure and the features therein may be combined to acquire new embodiments.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

The invention claimed is:

1. A display panel, comprising:
a base substrate comprising a display region, the display region comprising a first region, a second region surrounding the first region, and a transition region between the first region and the second region, a light transmittance of the first region being greater than that of the second region;
a plurality of first light-emitting elements arranged at the first region;
a plurality of second light-emitting elements, a plurality of first pixel circuitries and a plurality of second pixel circuitries arranged at the transition region, each first pixel circuitry being arranged between adjacent second pixel circuitries, an orthogonal projection of at least one second pixel circuitry onto the base substrate at least partially overlapping an orthogonal projection of at least one second light-emitting element onto the base substrate;
a plurality of first conductive lines each coupled between at least one first pixel circuitry and at least one first light-emitting element; and
a plurality of second conductive lines each coupled to at least one first pixel circuitry and extending along the at least one first pixel circuitry coupled to the plurality of second conductive lines to a side away from the at least one first light-emitting element;
wherein the at least one first pixel circuitry comprises a dummy electrode arranged at a side of the first conductive line away from the base substrate and electrically coupled to the first conductive line.

2. The display panel according to claim 1, wherein an orthogonal projection of each second conductive line onto the base substrate overlaps an orthogonal projection of the at least one first pixel circuitry or at least one second pixel circuitry onto the base substrate.

3. The display panel according to claim 1, wherein an angle between the first conductive line and the second conductive line is 175°±5°.

4. The display panel according to claim 1, further comprising a plurality of third light-emitting elements and a plurality of third pixel circuitries arranged at the second region, wherein a density of the third light-emitting elements is greater than or equal to a density of the first light-emitting elements at the first region and a density of the second light-emitting elements at the transition region.

5. The display panel according to claim 1, wherein each second conductive line extends along the at least one first pixel circuitry to a side away from the at least one first light-emitting element, and extends to a boundary between the second region and the transition region.

6. The display panel according to claim 5, wherein an end of each second conductive line extending to the boundary between the second region and the transition region is located at the transition region.

7. The display panel according to claim 5, wherein an end of each second conductive line extending to the boundary between the second region and the transition region is located at the second region.

8. The display panel according to claim 5, wherein an end of each of a part of the second conductive lines extending to the boundary between the second region and the transition region is located at the transition region, and an end of each of the other part of the second conductive lines extending to the boundary between the second region and the transition region is located at the second region.

9. The display panel according to claim 8, further comprising a plurality of third light-emitting elements arranged at the second region, wherein each third light-emitting element at least comprises one first subpixel, one second subpixel and two third subpixels, the two third subpixels are arranged in a same column and in different rows, the first subpixel and the second subpixel are arranged at a same side of the two third subpixels, and the first subpixel and the second subpixel are arranged in different columns and in different rows;

in a first direction, a boundary of the first region comprises a first lateral boundary and a second lateral boundary opposite to each other, at the first lateral boundary, the two third subpixels are arranged at a side close to the transition region, the first subpixel and the second subpixel are arranged at a side away from the transition region, and the first direction is a row direction of the third light-emitting elements;

at the first lateral boundary, the ends of the second conductive lines extending to the boundary between the transition region and the second region are flush with each other and spaced apart from the third subpixel at the second region closest to the transition region by a first distance; and at the second lateral boundary, the ends of the second conductive lines extending to the boundary between the transition region and the second region are not flush with each other, spaced apart from the first subpixel at the second region closest to the transition region by a second distance, and spaced apart from the second subpixel at the second region closest to the transition region by a third distance.

10. The display panel according to claim 9, wherein each of the first distance, the second distance and the third distance is greater than or equal to 2 μm.

11. The display panel according to claim 1, wherein a light transmittance of each of the first conductive lines and the second conductive lines is greater than or equal to 50%.

12. The display panel according to claim 11, wherein the first conductive lines are arranged at a same layer, and made of a same material, as the second conductive lines.

13. The display panel according to claim 12, wherein each of the first conductive lines and the second conductive lines is made of indium tin oxide (ITO) or indium zinc oxide (IZO).

14. The display panel according to claim 1, further comprising at least one third conductive line, wherein each third conductive line is coupled between at least one first pixel circuitry and at least one first light-emitting element, and each third conductive line is arranged at a layer different from the first conductive line.

15. The display panel according to claim 14, wherein each first pixel circuitry comprises a dummy electrode, and the third conductive line is arranged at a same layer, and made of a same material, as the dummy electrode.

16. The display panel according to claim 15, wherein each third conductive line extends from a dummy electrode at the transition region closest to the first region, and is coupled to a first light-emitting element at the first region closest to the transition region.

17. A display device, comprising the display panel according to claim 1.

18. The display device according to claim 17, wherein a camera element is arranged at a non-display side of the first region.

* * * * *